(12) United States Patent
Lin et al.

(10) Patent No.: US 9,219,012 B2
(45) Date of Patent: Dec. 22, 2015

(54) SEMICONDUCTOR DEVICE

(75) Inventors: Chih-Ping Lin, Taipei County (TW);
Pi-Kuang Chuang, Taichung (TW);
Hung-Li Chang, Hsinchu County (TW);
Shih-Ming Chen, Hsinchu (TW);
Hsiao-Ying Yang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 312 days.

(21) Appl. No.: 13/294,945

(22) Filed: Nov. 11, 2011

(65) Prior Publication Data

US 2012/0056295 A1    Mar. 8, 2012

Related U.S. Application Data

(62) Division of application No. 12/177,779, filed on Jul. 22, 2008, now Pat. No. 8,080,455.

(30) Foreign Application Priority Data

Mar. 21, 2008   (TW) ................. 97110053 A

(51) Int. Cl.
*H01L 29/00* (2006.01)
*H01L 21/8234* (2006.01)
*H01L 21/8238* (2006.01)

(52) U.S. Cl.
CPC *H01L 21/823481* (2013.01); *H01L 21/823412* (2013.01); *H01L 21/823493* (2013.01); *H01L 21/823807* (2013.01); *H01L 21/823878* (2013.01); *H01L 21/823892* (2013.01)

(58) Field of Classification Search
CPC ............... H01L 21/823412; H01L 21/823481; H01L 21/823493; H01L 21/823807; H01L 21/823878; H01L 21/823892; H01L 21/02565; H01L 29/7816; H01L 29/7802; H01L 29/7826
USPC ................................. 257/500–502
See application file for complete search history.

(56) References Cited

U.S. PATENT DOCUMENTS

| | | | |
|---|---|---|---|
| 7,067,365 B1 * | 6/2006 | Lee et al. ............ | 438/197 |
| 7,923,805 B2 * | 4/2011 | Chang et al. ......... | 257/500 |
| 2006/0223269 A1 * | 10/2006 | Honma ................ | 438/294 |
| 2008/0073745 A1 * | 3/2008 | Tang et al. .......... | 257/500 |

* cited by examiner

Primary Examiner — Thanh T Nguyen

(57) ABSTRACT

A method for fabricating a semiconductor device is provided. A substrate comprising a P-well is provided. A low voltage device area and a high voltage device area are defined in the P-well. A photoresist layer is formed on the substrate. A photomask comprising a shielding region is provided. The shielding region is corresponded to the high voltage device area. A pattern of the photomask is transferred to the photoresist layer on the substrate by a photolithography process using the photomask. A P-type ion field is formed outside of the high-voltage device area by selectively doping P-type ions into the substrate using the photoresist layer as a mask.

4 Claims, 7 Drawing Sheets

SEMICONDUCTOR DEVICE

This application is a divisional of U.S. application Ser. No. 12/177,779, filed Jul. 22, 2008, the entire disclosure of which is hereby incorporated by reference.

CROSS REFERENCE TO RELATED APPLICATIONS

This Application claims priority of Taiwan Patent Application No. 97110053, filed on Mar. 21, 2008, the entirety of which is incorporated by reference herein.

BACKGROUND OF THE INVENTION

1. Field of the Invention

The present invention relates to a method for fabricating a semiconductor device, and in particular relates a method for increasing a breakdown voltage of a semiconductor device.

2. Description of the Related Art

High voltage devices have been applied in various fields. Some examples of high voltage device usage include, a driver IC of a liquid crystal display, a power management IC, a power supply, a non-volatile memory, a communication circuit, and a control circuit. For the liquid crystal display, the logic circuit of the driver IC is derived under a low voltage or a medium voltage, and the liquid crystal display is derived under a high voltage. Thus, devices formed in a chip have different breakdown voltages. Therefore, the integrating capability of high voltage devices, low voltage devices, and medium voltage devices is a major issue for semiconductor device technologies.

Generally, a vertical electric field of a channel of most MOSFETs can be reduced by forming an insulator layer by a field implantation process under a gate and source/drain region. However, the method for fabricating the semiconductor device as described above results in current leakage at an edge of, or under, the source/drain region, thus reducing breakdown voltage of the device.

As such, a method for increasing breakdown voltage of a semiconductor device is needed.

BRIEF SUMMARY OF INVENTION

A detailed description is given in the following embodiments with reference to the accompanying drawings.

The invention provides a method for fabricating a semiconductor device. A substrate comprising a P-well is provided. A low voltage device area and a high voltage device area are defined in the P-well. A photoresist layer is formed on the substrate. A photomask comprising a shielding region is provided. The shielding region is corresponded to the high voltage device area. A pattern of the photomask is transferred to the photoresist layer on the substrate by a photolithography process using the photomask. A P-type ion field is formed outside of the high-voltage device area by selectively doping P-type ions into the substrate using the photoresist layer as a mask.

The invention also provides a semiconductor device. A substrate comprising a P-well is provided. A low voltage device area and a high voltage device area are disposed in the P-well. A first type ion field is disposed in the P-well and outside of the high voltage device area.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

Figure 1:
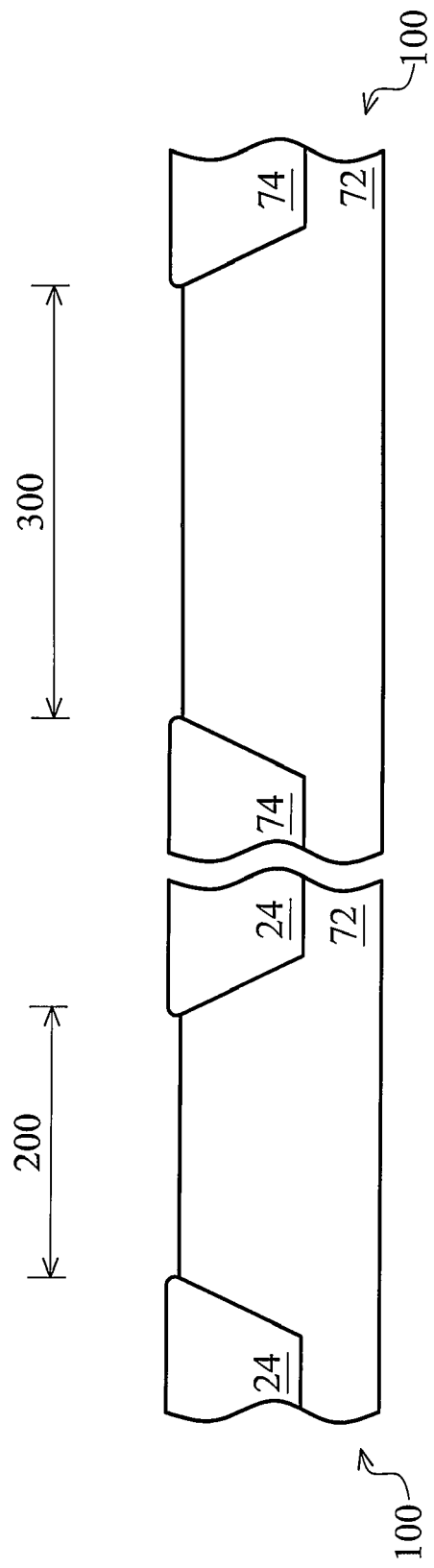
FIGS. 1 to 5 are cross-section views illustrating an embodiment of the method for fabricating the semiconductor device.

The following description is of the best-contemplated mode of carrying out the invention. This description is made for the purpose of illustrating the general principles of the invention and should not be taken in a limiting sense. The scope of the invention is best determined by reference to the appended claims.

Embodiments of the present invention provide a method for forming a semiconductor device. References will be made in detail to the present embodiments, examples of which are illustrated in the accompanying drawings. Wherever possible, the same reference numbers are used in the drawings and the descriptions to refer to the same or like parts. In the drawings, the shape and thickness of one embodiment may be exaggerated for clarity and convenience. The descriptions will be directed in particular to elements forming a part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

FIGS. 1 to 5 are cross-section views illustrating an embodiment of the method for fabricating the semiconductor device. Referring to FIG. 1, a substrate 100 with a P-well formed thereon is provided. The substrate 100 may comprise silicon. In alternative embodiments, SiGe, silicon on insulator (SOI), or other commonly used semiconductor substrates can be used for the substrate 100. Isolation structures 24 and 74, such as shallow trench isolation structures, are formed in the substrate 100, and thus a high voltage device area 200 and a low voltage device area 300 are defined. The shallow trench isolation structures may be formed by a shallow trench isolation (STI) process comprising steps, such as, etching a trench in the substrate 100, filling the trench with a dielectric material, such as a high-density plasma oxide, and planarizing by a chemical mechanical polishing (CMP) process. In an alternative embodiment, isolation structures 24 and 74 can be field oxides formed by a local oxidation of silicon (LOCOS) process.

Figure 2:
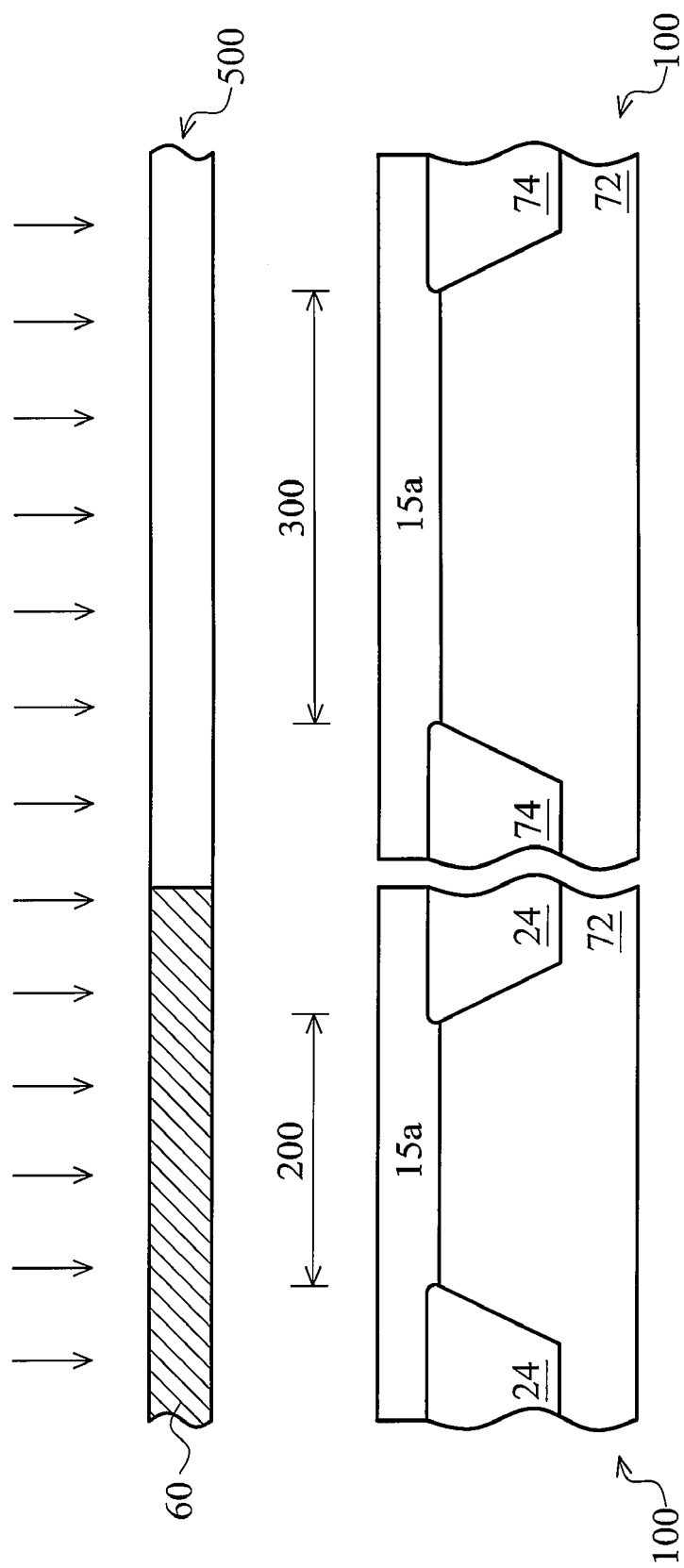

Referring to FIG. 2, a photoresist layer 15a used for a subsequent photolithography process is formed on the substrate 100. A photomask 500 comprising a shielding region 60 is then provided. The shielding region 60 may be corresponded to the high voltage device area 200 on the substrate 100. Then, the pattern of the photomask 500 is transferred onto the photoresist layer 15a on the substrate 100 by a photolithography process using the photomask 500.

Figure 6:
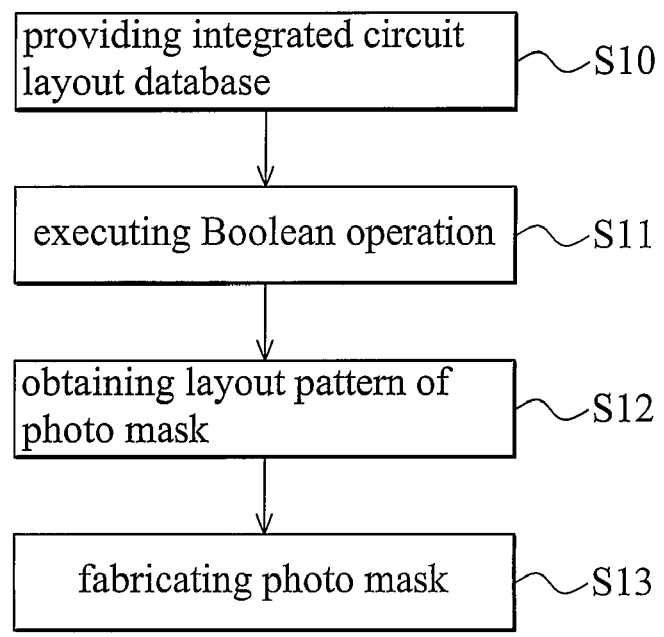
FIG. 6 illustrates a method for fabricating the photomask 500.

In an embodiment, the layout pattern of the photomask 500 may be obtained by using a Boolean logic operation. FIG. 6 illustrates a method for fabricating the photomask 500. First, an integrated circuit layout database is provided (step S10). The layout database may comprise an N-type ion implantation area data and a high voltage device area data. Then, the layout database is read and a Boolean logic operation is executed (step S11) to obtain an operation result. Finally, the layout pattern of the photomask 500 is obtained by using the operation result (step S12), and the photomask 500 is fabricated by using the layout pattern (step S13). The Boolean logic operation described above comprises defining an A, wherein A=the N-type ion implantation area data and the high-voltage device area data, and obtaining an B, wherein B=an implantation area outside of the A.

Figure 3:
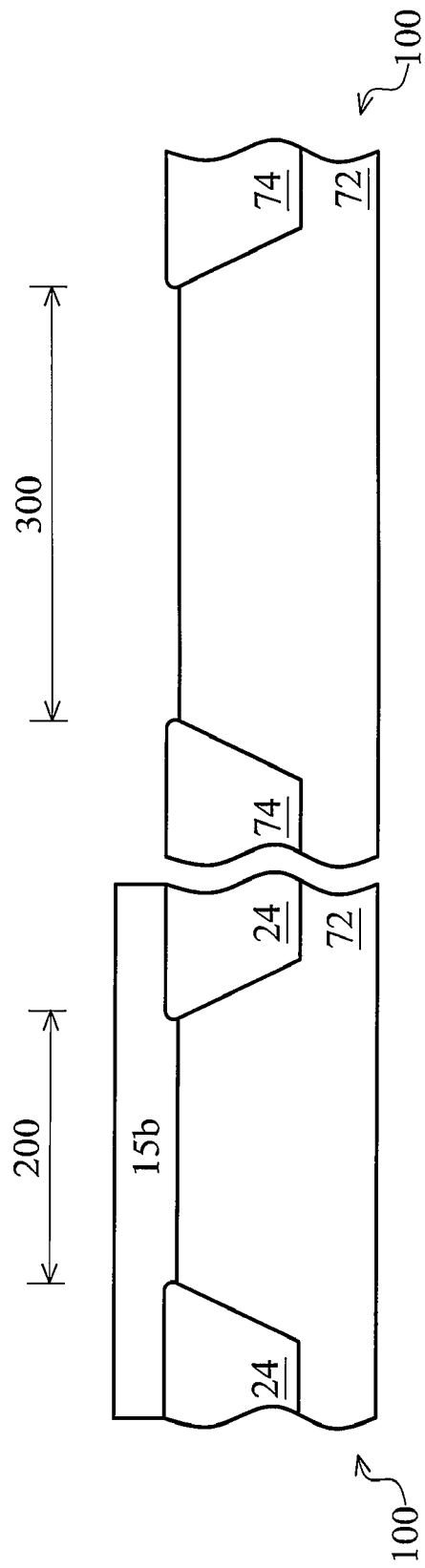

Referring to FIG. 3, the photoresist layer 15a is patterned to form a patterned photoresist layer 15b only covering the high voltage device area 200.

Figure 4:
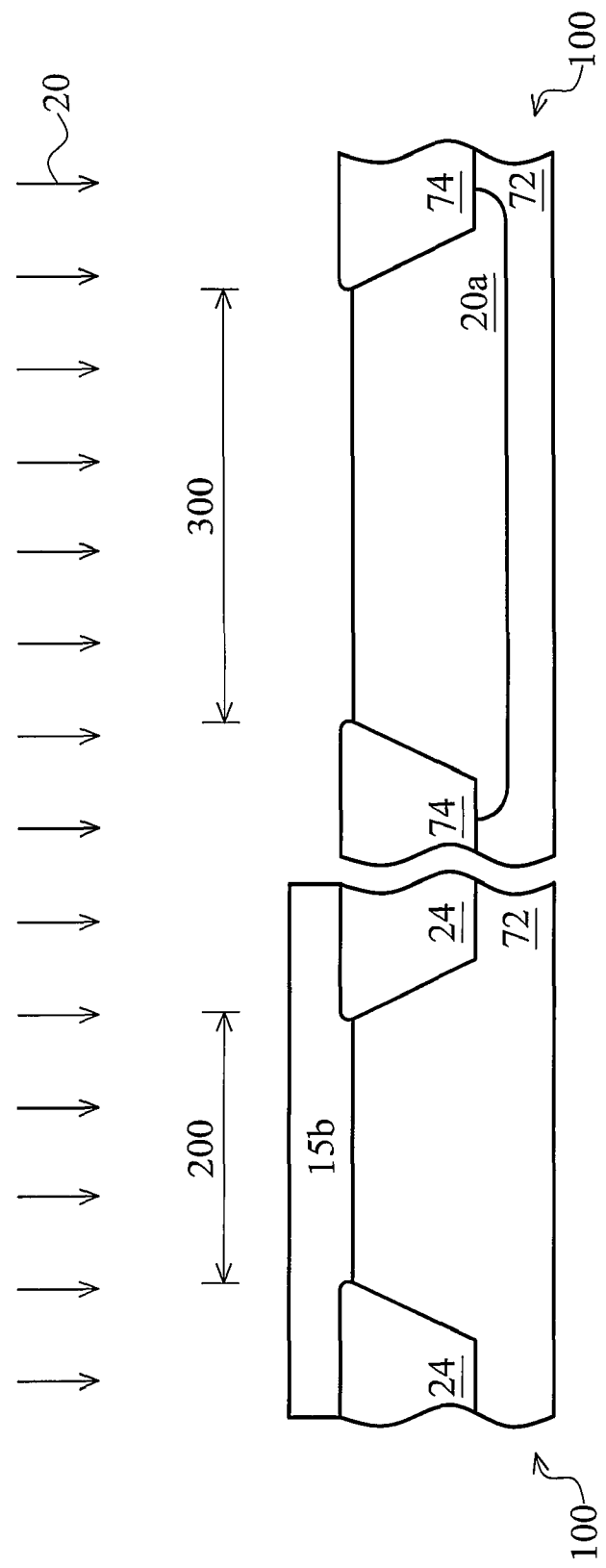

Referring to FIG. 4, a P-type ion field 20a is formed in the low voltage device area 300 outside of the high-voltage device area 200 by a field implantation 20 of a high-density of P-type ions in the substrate 100 using the patterned photoresist layer 15b as a mask. Namely, the P-type ion field 20a is only formed in the low voltage device area 300, and is not formed in the high voltage device area 200. A distance between the P-type ion field 20a and the high voltage device area 200 is not less than 0.5 μm. In an embodiment, the field implantation 20 is performed with a dosage of P-type ion of about $1E12$ ions/cm$^2$1~E13 ions/cm$^2$, such as B+ ions. The P-type ion field 20a can be used for isolation among devices formed in the low voltage device areas 300 later.

Figure 5:
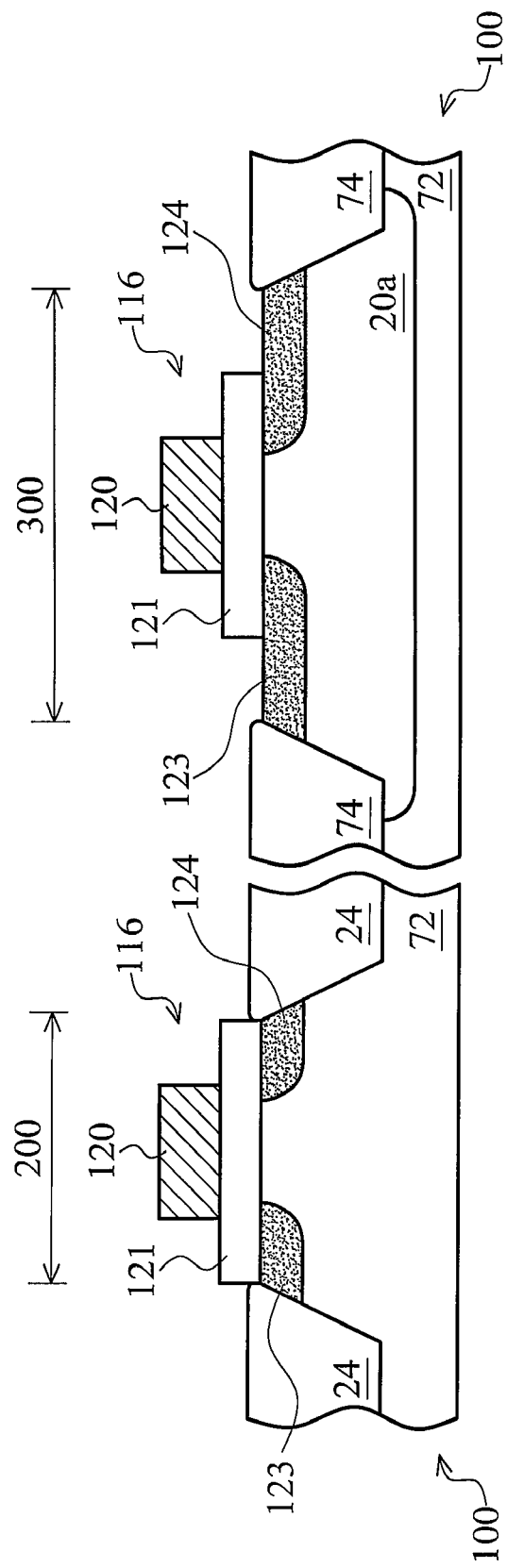

Referring to FIG. 5, MOS devices 116 are formed on the high voltage device area 200 and the low voltage device areas 300. The MOS devices 116 comprise a source region 123 and a drain region 124. The source region 123 and the drain region 124 may be formed by implantation. The MOS devices 116 further comprise a gate electrode 120 and a gate dielectric 121. In an embodiment, the gate dielectric 121 may comprise oxide formed by a dry or wet thermal oxidation with an environment including oxide, water, nitric oxide, or combination thereof, or formed by a chemical vapor deposition process using tetraethoxysilane (TEOS) or oxygen as precursor.

The gate electrode 120 may comprise a conductor material, such as tantalum (Ta), titanium (Ti), molybdenum (Mo), tungsten (W), platinum (Pt), aluminum (Al), hafnium (Hf), or ruthenium (Ru), or metal nitride or metal silicide thereof. In an embodiment, the gate electrode 120 may comprise polysilicon, such as doped polysilicon or undoped polysilicon formed by a chemical vapor deposition process.

The gate electrode 120 and the gate dielectric 121 may be patterned by a photolithography process. The photolithography process usually comprises forming a photoresist mask by coating a photoresist, and then masking, exposing, and developing the photoresist. As shown in FIG. 5, after the photoresist mask is patterned, a portion of the gate electrode and the gate dielectric is removed to form the gate electrode 120 and gate dielectric 121 by an etching process.

The P-type ion field with high dopant concentration is not adjacent to the MOS device 116 on the high voltage device area 200, thus, leakage occurring in the interface between the MOS device 116 and the high voltage device area 200 is decreased. Therefore, breakdown voltage of the device is improved, and operation voltage range is increased.

Figure 7:
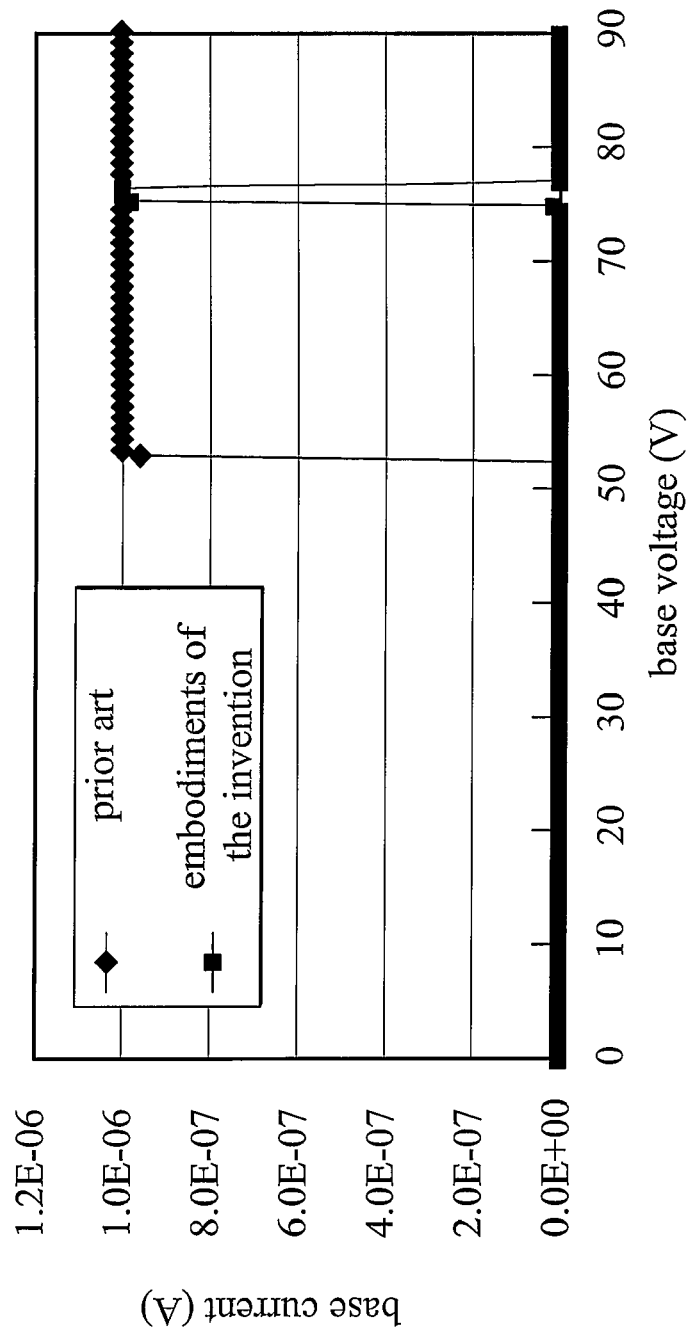
FIG. 7 illustrates the breakdown voltage of the semiconductor device as known in prior art and one embodiment of the semiconductor device of the invention.

FIG. 7 illustrates the breakdown voltage of the semiconductor device as known in the prior art and one embodiment of the semiconductor device of the invention. The breakdown voltage of the semiconductor device as known in the prior art is about 54 V. The breakdown voltage of one embodiment of the semiconductor device of the invention is about 76 V. In other words, the breakdown voltage of embodiments of the semiconductor device of the invention is increased to above about 40% compared to the semiconductor device as known in the prior art.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate comprising a P-well;
   an isolation structure disposed in the substrate to a first depth;
   a low voltage device area and a high voltage device area both disposed entirely inside in the P-well, wherein the low voltage device area and the high voltage device are defined by the isolation structure; and
   a P-type ion field disposed in the low voltage device area and outside of the high-voltage device area, wherein a second depth of the P-type ion field is greater than the first depth.

2. The semiconductor device as claimed in claim 1, wherein the distance between the P-type ion field and the high-voltage device area is not less than 0.5 μm.

3. The semiconductor device as claimed in claim 1, wherein the isolation structure is a shallow trench isolation structure formed by a shallow trench process.

4. The semiconductor device as claimed in claim 1, wherein the isolation structure is a filed oxide structure formed by local oxidation.

* * * * *